United States Patent
Doderer et al.

(10) Patent No.: US 6,890,766 B2
(45) Date of Patent: May 10, 2005

(54) DUAL-TYPE THIN-FILM FIELD-EFFECT TRANSISTORS AND APPLICATIONS

(75) Inventors: Thomas Doderer, Munich (DE); Wei Hwang, Armonk, NY (US); Chang C. Tsuei, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/419,428

(22) Filed: Apr. 21, 2003

(65) Prior Publication Data

US 2003/0201495 A1 Oct. 30, 2003

Related U.S. Application Data

(62) Division of application No. 09/314,436, filed on May 18, 1999, now abandoned.
(60) Provisional application No. 60/124,867, filed on Mar. 17, 1999.

(51) Int. Cl.[7] .............................................. H01L 21/00
(52) U.S. Cl. .......................................... 438/2; 438/149
(58) Field of Search ............................ 438/2, 149, 151

(56) References Cited

U.S. PATENT DOCUMENTS 5,278,136 A * 1/1994 Bednorz et al. ............ 505/330
6,121,642 A * 9/2000 Newns ....................... 257/192

FOREIGN PATENT DOCUMENTS

| JP | 02-100382 | 4/1990 |
|---|---|---|
| JP | 04-032264 | 2/1992 |
| JP | 05-190924 | 7/1993 |
| JP | 11-163365 | 6/1999 |

OTHER PUBLICATIONS

Levy, A., et al., *Field–Effect Conductance of $YBa_2 Cu_3 O6$*, J. Appl. Phys, vol. 69, No. 8, Apr. 15, 1991, pp. 4439–4441.
Newns, D.M., et al., *Mott Transition Field Effect Transistor*, Appl. Phys. Lett., vol. 73, No. 6, Aug. 10, 1998, pp. 780–782.

* cited by examiner

Primary Examiner—Phat X. Cao
(74) Attorney, Agent, or Firm—Robert M. Trepp; Frank V. DeRosa

(57) ABSTRACT

A microelectronic device includes a gate layer adapted to receive an input voltage. An insulating layer is formed on the gate layer, and a conductive channel layer is formed on the insulating layer and carries current between a source and a drain. The conductive channel layer is adapted to provide a dual channel. The dual channel includes both a p-channel and an n-channel wherein one of the p-channel and the n-channel are selectively enabled responsive to the input voltage polarity. A method for forming the device and applications are also disclosed and claimed.

5 Claims, 16 Drawing Sheets

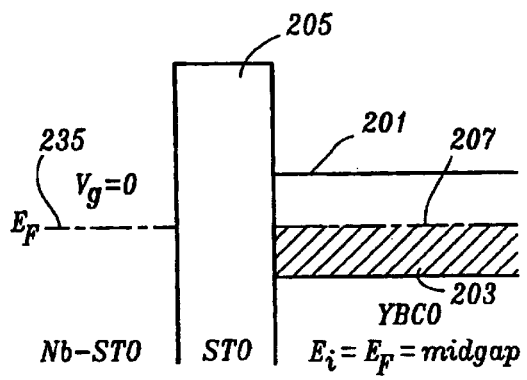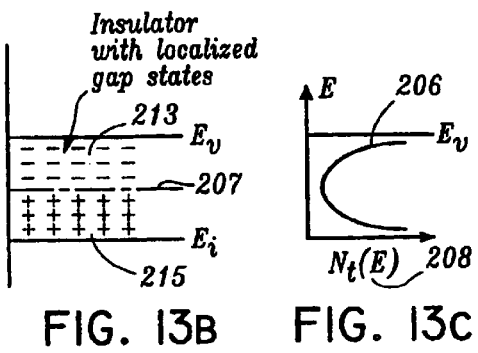
FIG. 13A  FIG. 13B  FIG. 13C
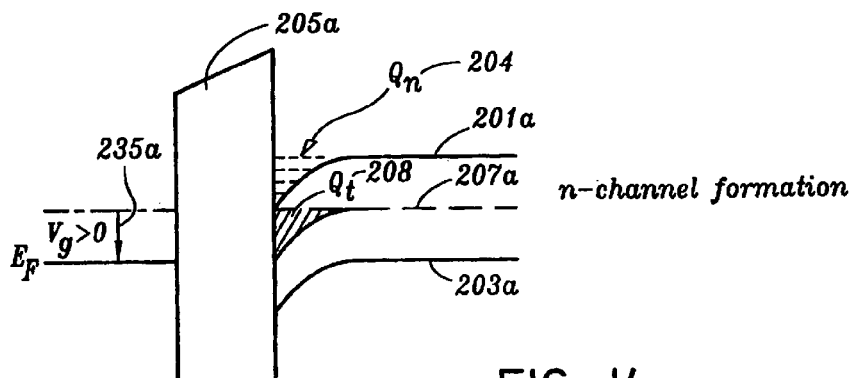
FIG. 14
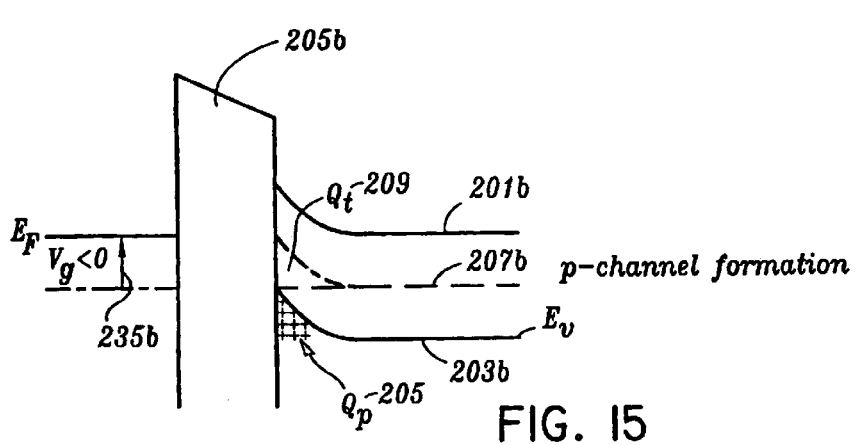
FIG. 15

DUAL-TYPE THIN-FILM FIELD-EFFECT TRANSISTORS AND APPLICATIONS

CROSS REFERENCE TO RELATED APPLICATIONS

This application is a Divisional of U.S. application Ser. No. 09/314,436 filed on May 18, 1999, now abandoned. which claims priority to Provisional Application Ser. No. 60/124,867 filed Mar. 17, 1999, which are incorporated herein by reference.

BACKGROUND OF THE INVENTION

1. Field of the Invention

The present invention generally relates to the field of thin film microelectronic components, more particularly, to a dual-type thin film field effect transistor (TFT) comprising perovskite or Mott-insulator-based materials and to microelectronic and optoelectronic applications.

2. Description of the Related Art

The semiconductor industry has been based mainly on the implementation and characteristics of silicon-based devices. The search for new microelectronic devices which may function as switches beyond silicon based (Si-based) materials has become a new challenge. Complementary metal oxide semiconductor (CMOS) technology has played a major role in the microelectronic industry. Si-based CMOS technology provides primarily two types of transistors, an n-type transistor (NMOS) and a p-type transistor (PMOS). These are fabricated in silicon by using either negatively diffused (doped) silicon that is rich in electrons, or positively doped silicon that is rich in holes.

Transistors can also be formed either in the bulk or thin film technologies. In the typical n-well CMOS process, a p-channel (p-type) transistor is formed in the n-well itself and an n-channel (n-type) transistor in the p-substrate.

To provide more versatility to semiconductors, a device which could provide a selective channel for conduction based on an input signal is desirable. Therefore, a need exists for a dual (n/p) type thin film field effect transistor (TFT), such that when a change to the applied polarity of the gate voltage is provided, an n-type or p-type conducting channel is achieved in a single device.

SUMMARY OF THE INVENTION

It is therefore an object of the present invention to provide a method and structure in which a single device performs both n-type and p-type conduction. This provides advantages of simplifying the fabrication steps and interconnections, increasing the device package density and exploring new microelectronic or optoelectronic circuit applications.

It is another object of the present invention to provide a method and corresponding structure in which high performance thin film transistor (TFT) device structures are formed of three terminal devices (gate, source and drain).

It is still another object of the present invention to provide a method and corresponding structure in which controllable TFT device structures are formed of either three or four terminal devices with top and bottom gates to control threshold (turn-on) voltage and channel conduction.

It is a further object of the present invention to provide a method and fabrication process to realize switching devices in the framework of perovskite materials or Mott-insulator materials. For example, the present invention may employ the following compounds: $YBa_2Cu_3O_{7-\delta}$ where $\delta$ is between 0 and about 1, $La_{2-x}Sr_xCuO_4$ where x is between 0 and about 1, $Nd_{2-x}Ce_xCuO_{4-\delta}$ where $\delta$ is between 0 and about 1 and where x is between 0 and about 1, $Bi_2Sr_2Ca_nCu_{n+1}O_{6+2n}$, $HgBa_2Ca_nCu_{n+1}O_{2n+4}$, $Tl_2Ba_2Ca_nCu_{n+1}O_{6+2n}$, $(Sr_{1-x}Ca_x)_3Ru_2O_7$ where x is between 0 and about 1 and $(Sr/Ca)_{n+1}Ru_nO_{3n+1}Sr$.

It is another object of the invention to provide a new YBCO ($YBa_2Cu_3O_7$) channel material to realize dual-type TFT switch devices.

It is yet another object of the invention to provide that the dual-type switch device operates in an accumulation mode.

It is still another object of the invention that the dual-type single device provide many analog circuit applications, for example, full-wave rectifier circuits.

It is a further object of the invention that the 4 diodes of a conventional full-wave bridge rectifier can be replaced by the disclosed single-type TFT device.

It is another object of the invention to provide dual-type devices that can be readily extended to new microelectronic and optoelectronic applications such as logic gates, multi-level memory cells, and display or LED driver devices.

A microelectronic device includes a gate layer adapted to receive an input voltage. An insulating layer is formed on the gate layer, and a conductive channel layer is formed on the insulating layer for carrying current between a source and a drain. The conductive channel layer is adapted to provide a dual channel. The dual channel includes both a p-channel and an n-channel wherein one of the p-channel and the n-channel are selectively enabled responsive to the input voltage.

A circuit, in accordance with the present invention, includes a thin film transistor having a gate, a source and a drain. The thin film transistor includes a gate layer for forming the gate. The gate is adapted to receive an input voltage. An insulating layer is formed on the gate layer. A conductive channel layer is formed on the insulating layer for carrying current between the source and the drain. The conductive channel layer is adapted to provide a dual channel, and the dual channel includes both a p-channel and an n-channel wherein one of the p-channel and the n-channel are selectively enabled responsive to the input voltage.

In alternate embodiments, the gate layer may include a recessed gate structure. The conductive channel layer may include a Mott insulator material, such as $YBa_2Cu_3O_{7-\delta}$ where $\delta$ is between about 0 and about 1, preferably between about 0 and about 0.5. The gate layer may include strontium titanium oxide doped with niobium and the insulating layer may include strontium titanium oxide. The p-channel is preferably formed responsive to a negative input voltage, and the n-channel is preferably formed responsive to a positive input voltage. The p-channel preferably includes a hole accumulation layer responsive to a negative input voltage, and the n-channel preferably includes an electron accumulation layer responsive to a positive input voltage. The microelectronic device preferably includes a thin film transistor. The source or the drain may be coupled to a load and the other of the source and the drain is coupled to an alternating voltage such that the thin film transistor rectifies the alternating voltage across the load. The thin film transistor may be coupled to and drive a light emitting diode.

A method for forming a dual channel transistor includes the steps of providing a gate layer for receiving input voltages, depositing an insulating layer on the gate layer, forming a dual channel layer on the insulating layer by: epitaxially depositing a cuprate layer on the insulating layer and annealing the cuprate layer in the presence of oxygen to provide a substantially defect free cuprate layer such that the dual channel includes both a p-channel and an n-channel wherein one of the p-channel and the n-channel are selectively enabled responsive to the input voltage during operation, and forming source and drain electrodes on the conductive channel layer.

In other methods, the step-of providing a gate layer may include the step of patterning the gate layer to form a recessed gate structure. The cuprate layer may include a Mott insulator material, such as $YBa_2Cu_3O_{7-\delta}$ where $\delta$ is between about 0 and about 1, preferably between about 0 to about 0.5. The step of providing an oxide gate layer may include the step of doping the gate layer. The method may further include the step of forming a hole accumulation layer responsive to a negative input voltage. The method may further include the step of forming an electron accumulation layer responsive to a positive input voltage. The step of annealing may include the step of maintaining a temperature of between about 200° C. and about 500° C. for between about 0.2 hours and about 5 hours. The step of annealing may include the step of annealing in oxygen to adjust oxygen content of the cuprate layer. The step of annealing may include the step of annealing in a reducing environment including one of a vacuum and an inert gas.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein:

FIGS. 13*a–c* depict an example of energy-band diagrams of Mott-insulator material (M-I-Mt) structures, illustrating the presence of localized gap states in accordance with the present invention;

FIG. 14 depicts a schematic example of an energy-band diagram of an M-I-Mt structure, illustrating an n-channel formation with positive voltage applied to the gate, in accordance with one aspect of the present invention;

FIG. 15 depicts a schematic example of an energy-band diagram of an M-I-Mt structure, illustrating a p-channel formation with negative voltage applied to the gate in accordance with another aspect of the present invention;

These drawings are shown as illustrations of the invention but they do not restrict its scope as set forth in the appended claims.

DETAILED DESCRIPTION OF PREFERRED EMBODIMENTS

The present invention relates to microelectronic devices and, more particularly to thin film transistors. A dual (n/p) type thin film field effect transistor (TFT) is disclosed in accordance with the present invention. A channel material of a three-terminal dual (n/p) type device preferably includes a thin film of a Mott-insulator-based material such as $YBa_2Cu_3O_{7-\delta}$—(YBCO) where $\delta$ is between about 0 to about 1 and preferably between about 0 and about 0.5. The present invention may employ other compounds as well. These compounds may include: $La_{2-x}Sr_xCuO_4$ where x is between 0 and about 1, $Nd_{2-x}Ce_xCuO_{4-\delta}$ where $\delta$ is between 0 and about 1 and where x is between 0 and about 1, $Bi_2Sr_2Ca_nCu_{n+1}O_{6+2n}$, $HgBa_2Ca_nCu_{n+1}O_{2n+4}$, $Tl_2Ba_2Ca_nCu_{n+1}O_{6+2n}$, $(Sr_{1-x}Ca_x)_3Ru_2O_7$ where x is between 0 and about 1 and $(Sr/Ca)_{n+1}Ru_nO_{3n+1}Sr$. The present invention includes novel device structures and fabrication process steps. Several post-deposition thermal or laser annealing steps for changing the oxygen content are employed for device optimization. Depending on the applied polarity of the gate voltages, either an n-type or a p-type conducting channel is achieved in the same single device. This new type of device leads to a multitude of analog/digital or digital/digital circuit applications, such as single device full-wave rectifier, logic gates, multi-level memory cells and display driver devices. The new type of device is-preferably a TFT device although the present invention may include of transistor structures. The transistor of the present invention may be referred to as a dual type TFT, a dual type MTFT, or MTFET.

Figure 1:
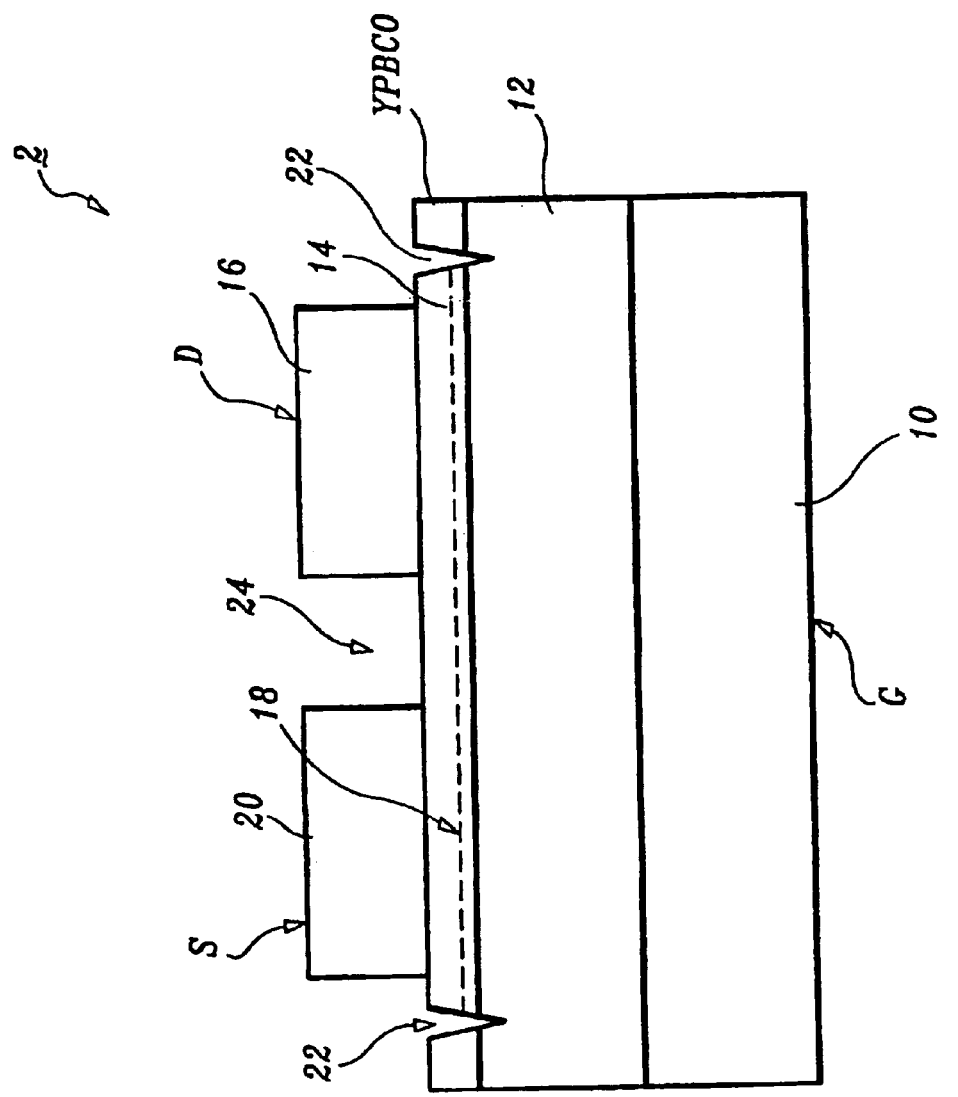
FIG. 1 is a cross-sectional view of an oxide Mott-insulator thin film transistor (MTFT) device having a single p-channel in accordance with the prior art.

Referring now to-the drawings in which like numerals represent the same or similar elements and initially to FIG. 1, a conventional Mott Transition Field Effect Transistor (MTFET) 2 is shown. A MTFET is described in the art (see e.g., D. M. Newns, et al., "Mott transition field effect transistor", Applied Physics Letters, Vol. 73. No. 6, pp. 780–782, August 1998). The MTFET is an FET-type device where a channel 18 is made from a material capable of undergoing a Mott metal-insulator transition (also called a "Mott insulator"). Transport in such a channel material essentially experiences a mobility transition as well as a change in a carrier number as the gate voltage changes. In the channel material's insulating state, mobility and carrier concentration are low, in the channel material's metallic state, the mobility and carrier concentration are high, enabling the channel to conduct. A prior-art p-type MTFET device is shown in FIG. 1. A gate (G) 10, forming the substrate in the structure, consists of a (100)-oriented crystal of conducting n-type $SrTiO_3$ (STO) with 1 wt % of Niobium (Nb). A 400 nm insulating layer 12 of pure STO is epitaxially deposited on Nb-STO of gate 10. A further epitaxial layer 14 consisting of $Y_{0.5}Pr_{0.5}Ba_2Cu_3O_{7-\delta}$ (YPBCO) where $\delta$ is between 0 and 0.5 is deposited on the surface of insulating layer 12. The epitaxial layer 14 forms the Mott-insulator conducting channel 18 of the MTFET. Next, platinum (Pt) electrodes 16 and 20 are deposited on the cuprate surface using a stencil mask, forming the source (S) 20 and drain (D) 16 electrodes. Finally, the device is completed by a laser isolation trench 22. A channel length 24, is 5 microns. This type of device is a p-type or p-channel device and operates via a Mott metal-insulator transition induced by the gate field as conventional transistors. The channel for this disclosed device 2 includes operation similar to the operation of a CMOS device. A single channel (p-channel) is formed when the gate is activated.

The present invention is directed to high performance MTFET devices and structures based on Mott-insulator materials, such as $YBa_2Cu_3O_7$ (YBCO) or $YBa_2Cu_3O_{7-\delta}$ where $\delta$ is between about 0 to about 1. Advantageously, a single device provides dual (n/p) operation. In other words, it can form either n-channel or p-channel conduction, controlled by the electrical polarity of the gate field.

The new dual (n/p) type can be configured as either three terminal or four terminal thin film field effect transistors (TFTs). The channel material is based on a cuprate material, perovskite or similar Mott-insulator materials. These materials may include $La_{2-x}Sr_xCuO_4$ where x is between 0 and about 1, $Nd_{2-x}Ce_xCuO_{4-\delta}$ where $\delta$ is between 0 and about 1 and where x its between 0 and about 1, $Bi_2Sr_2Ca_nCu_{n+1}O_{6+2n}$, $HgBa_2Ca_nCu_{n+1}O_{2n+4}$, $Tl_2Ba_2Ca_nCu_{n+1}O_{6+2n}$, $(Sr_{1-x}Ca_x)_3Ru_2O_7$ where x is between 0 and about 1 and/or $(Sr/Ca)_{n+1}Ru_nO_{3n+1}Sr$. Combinations of theses materials may also be employed. The following drawings will describe the disclosed device structures and fabrication methods, device operation principles and applications.

Figure 2:
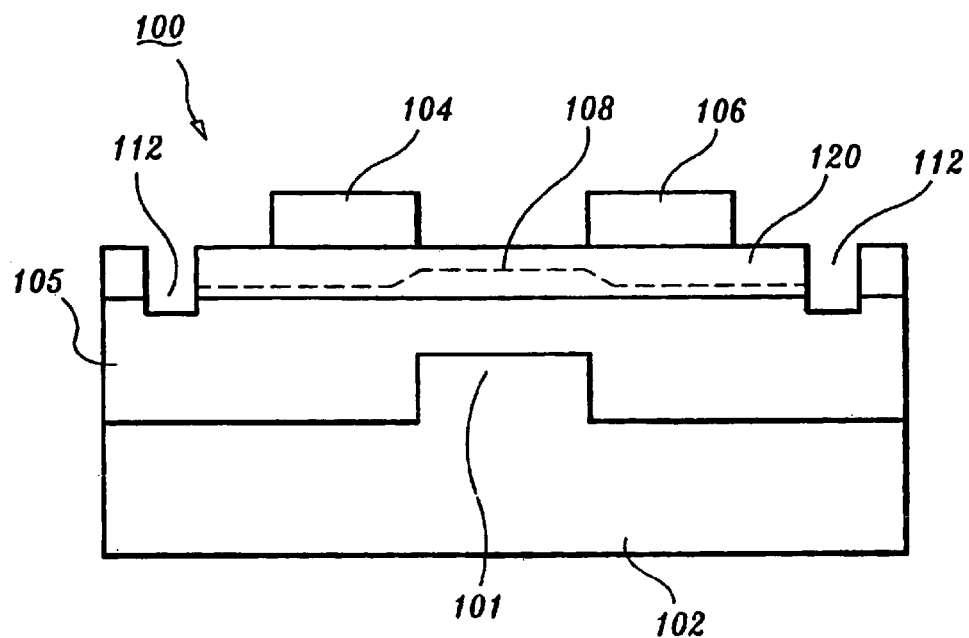
FIG. 2 is a cross-sectional view of a dual type TFT in accordance with the present invention.

Referring to FIG. 2, a cross-sectional view of one embodiment of a high performance MTFET TFT (MTFT) structure or dual type MTFT is shown. Structural features of the device and its fabrication play an important role in its successful operation. To obtain optimum MTFT performance, it is preferable to grow a channel 108 epitaxially. A substrate 102 is included. Substrate 102 preferably is a metallic substrate and uses Nb-doped $SrTiO_3$ (STO) with about 0.5 wt % of Nb. Substrate 102 may alternately be doped with other dopants such as, Mn, Pb, Fe, Ti, etc. Substrate 102 may be formed from yttrium (Y) stabilized zirconium (Zr) (YSZ), lanthanum aluminate, titanium dioxide, neodymium gallate. These substrate materials may be doped as well to improve conductivity. Substrate 102 also serves as a gate electrode and includes a recessed gate 101 which permits a high performance conducting channel 108. As will be discussed in more detail below, recess gate 101 provides improved performance for the present invention.

A high dielectric constant gate insulator 105 is grown preferably epitaxially on substrate 102. Gate insulator 105 preferably includes STO, although other insulators compatible with substrate 102 may be used. Channel material 120, for example YBCO, is deposited. Both gate insulator 105 and channel material 120 are preferably deposited by laser ablation from stoichiometric targets in an oxygen atmosphere. A source 104 electrode and drain 106 electrode are deposited. Preferably, source 104 and drain 106 include platinum (Pt) and are deposited by electron beam evaporation through a stencil mask of silicon. The individual devices on a chip or device 100 can be isolated from each other by, for example, laser ablated trenches 112.

Figure 3:
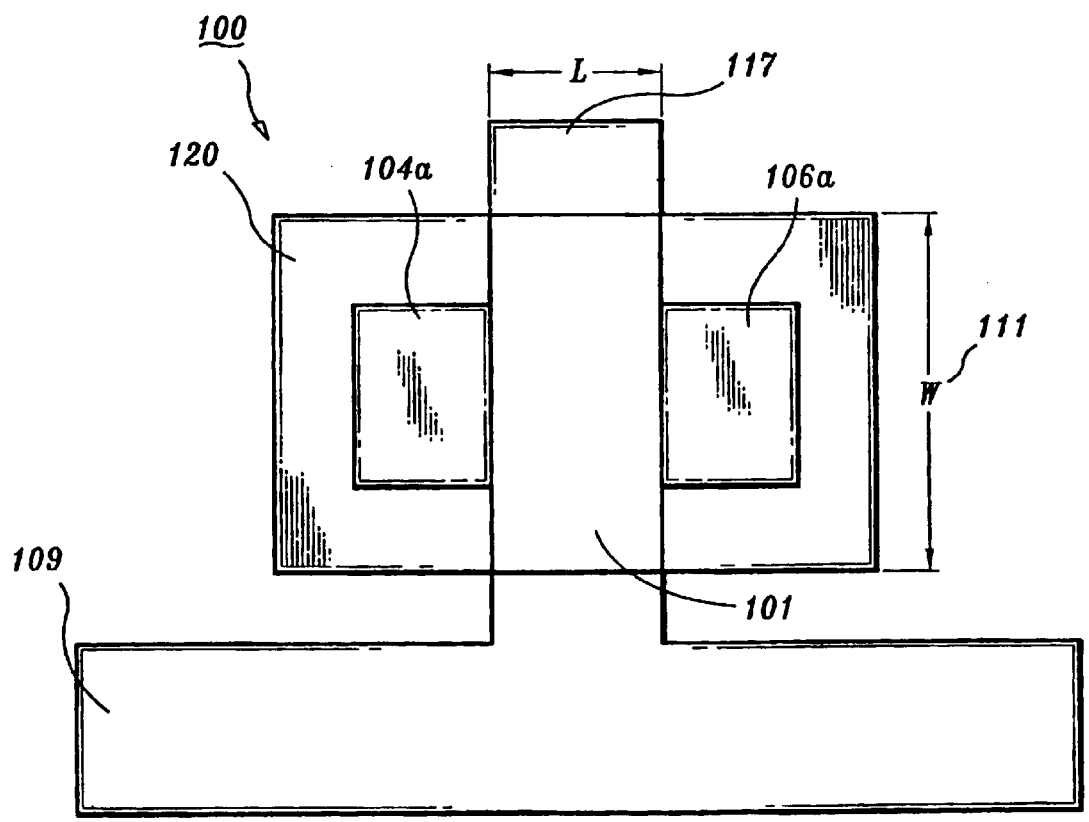
FIG. 3 is a top view of the TFT of FIG. 2 in accordance with the present invention.

Referring to FIG. 3, a top view of a version of a MTFT device in accordance with the present invention is shown. Device 100 may include the following illustrative dimensions. These dimensions are illustrative only and are not to be construed as limiting. A channel length 117 designated as L may include a length of about 5 microns, and a width 111 of about 90 microns. Recess gate 101 for device 100 is connected to a global wordline 109. The width of source 104*a* and drain 106*a* electrodes are about 50 microns. The thickness of gate insulator 105 is about 200–300 nm and a channel thickness (into the page) is about 50 nm.

The detailed fabrication process steps for discrete and integrated three terminal or four terminal $YBa_2Cu_3O_7$ (YBCO or Mott-insulator materials) thin film field effect transistors (TFT) are as follows.

Figure 4:
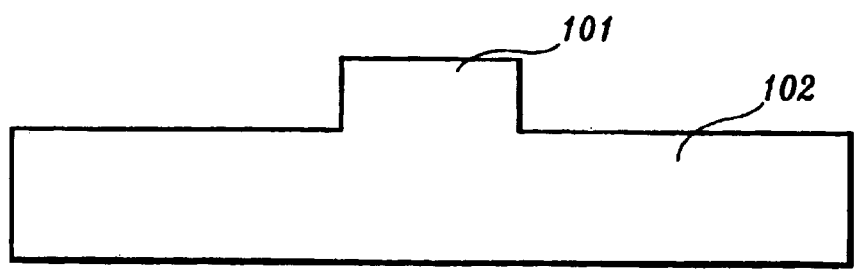
FIG. 4 is a cross-sectional view of a gate layer for a dual type TFT forming a substrate of the structure and showing a pattern to form a discrete recess gate, in accordance with the present invention.
Figure 5:
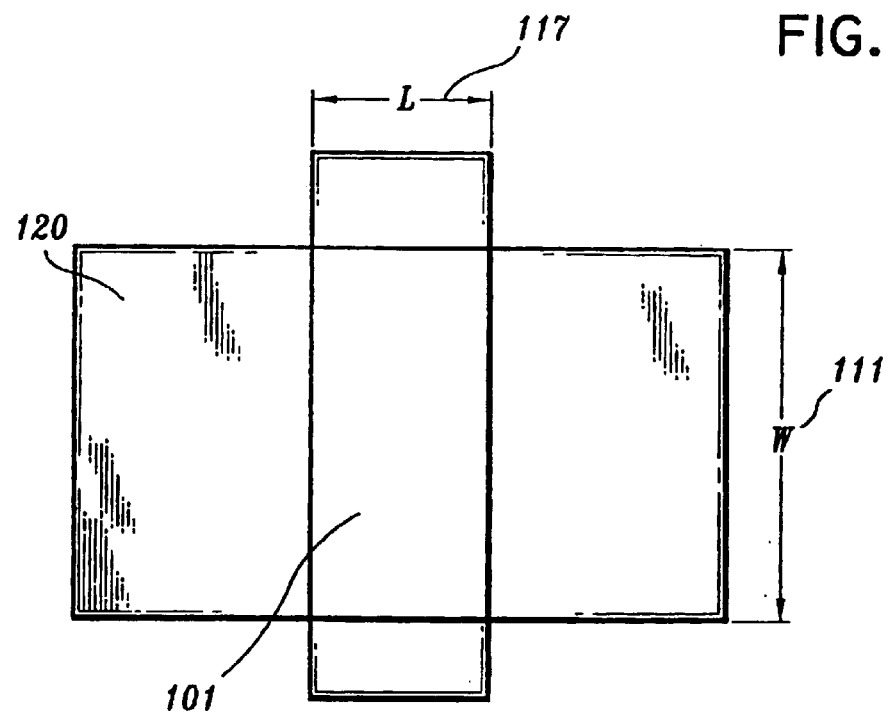
FIG. 5 is a top view of a dual type TFT showing a mask pattern to form a recess gate and TFT device area, in accordance with the present invention.

Referring to FIG. 4, a first step in an TFT process is shown for forming a gate of a device using substrate 102 of the structure. Substrate 102 is patterned to form a discrete recess gate 101. Substrate 102 of the structure is preferably formed from a Nb-STO (100)-cut crystal and serves as a gate. The gate is patterned to form recess gate 101 preferably by optical or e-beam lithography with an appropriate mask. Referring to FIG. 5, an example of a mask pattern to form recess gate 101 in a MTFT device area having width 111 and length 117 are shown in a top view.

Figure 6:
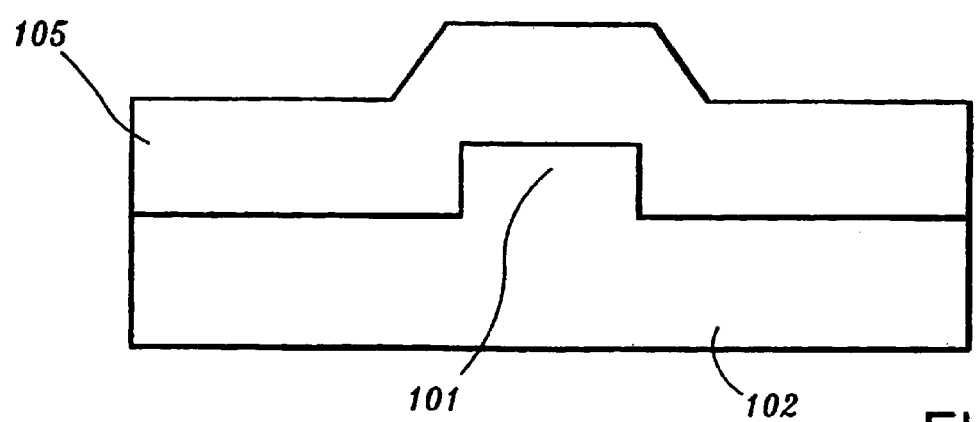
FIG. 6 is a cross-sectional view of the TFT of FIG. 4 showing a thin insulating layer deposited over the gate layer/substrate, in accordance with the present invention.
Figure 7:
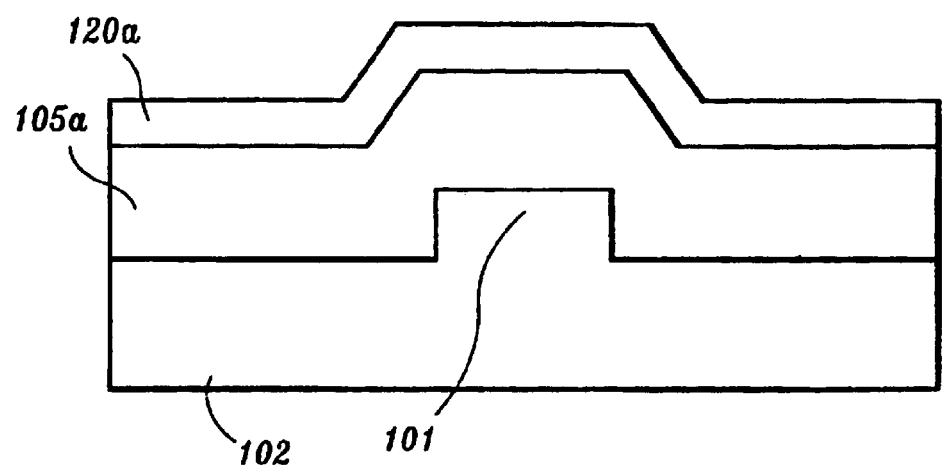
FIG. 7 is a cross-sectional view of the TFT of FIG. 6 showing an epitaxial layer of a cuprate material for forming a conducting channel sheet over an insulating layer, in accordance with the present invention.
Figure 8:
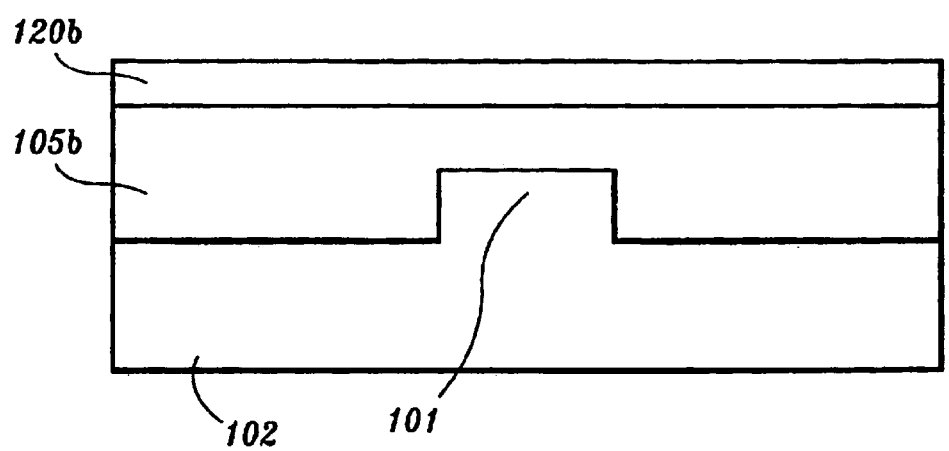
FIG. 8 is a cross-sectional view of the TFT of FIG. 4 showing an epitaxial layer of a cuprate material for forming a conducting channel sheet deposited over an insulating layer, a chemical-mechanical polishing technique being used to planarize the insulating layer, in accordance with the present invention.

Referring to FIG. 6, a thin insulating layer 105 is deposited. Layer 105 preferably includes STO on the Nb-STO surface of substrate 102. Layer 105 is preferably deposited using a pulsed laser ablation process. Optionally, the surface of layer 105 may be planarized by a conventional chemical-mechanical polishing (CMP) process to provide a flat surface (see FIG. 8). FIGS. 7 and 8 represent two structures of the present invention. Find numerals are employed with a same number for a same or similar feature in the embodiments. The find numerals will include a letter to designate a different embodiment.

Referring to FIG. 7, an epitaxial layer 120*a* of a cuprate material (such as YBCO) is deposited to form a conducting channel sheet over a layer 105*a*. For good device performance, layer 120*a* is preferably grown with a high oxygen content, to ensure a minimum of lattice defects in the film. Processing parameters may include low laser deposition rate (for example, laser pulsing at about 2 Hz). An oxygen environment is provided during processing which may include an oxygen partial pressure of about 300 mTorr. Substrate 102 may be maintained at about 650° C. to about 850° C. To produce an intrinsic high resistive channel, several post-annealing steps to optimize the field effect response are employed. In a preferred method, post-annealing includes maintaining a temperature of between about 200° C. to about 500° C. for between about 0.2 hours and about 5 hours in a reduced atmosphere environment such as Argon or other inert gases or in a vacuum. A resistance measurement of the device channel may be made during processing to monitor the progress and ensure performance of the devices. An oxygen anneal is preferably performed after or between post-annealing to adjust the oxygen content of the conductive channel layer.

Referring to FIG. 8, another embodiment is shown wherein an epitaxial layer 120*b* of a cuprate material (such as YBCO) is deposited to form a conducting channel sheet over a flat layer 105*b* formed by a chemical-mechanical polishing technique as described above. Layer 120*b* is preferably deposited on a (100) surface of an already planarized layer 105*b* by an in situ target change within a laser ablation chamber. Layer 120*b* (120*a*) forms the Mott-insulator dual-type conducting channel of the TFT.

Figure 9:
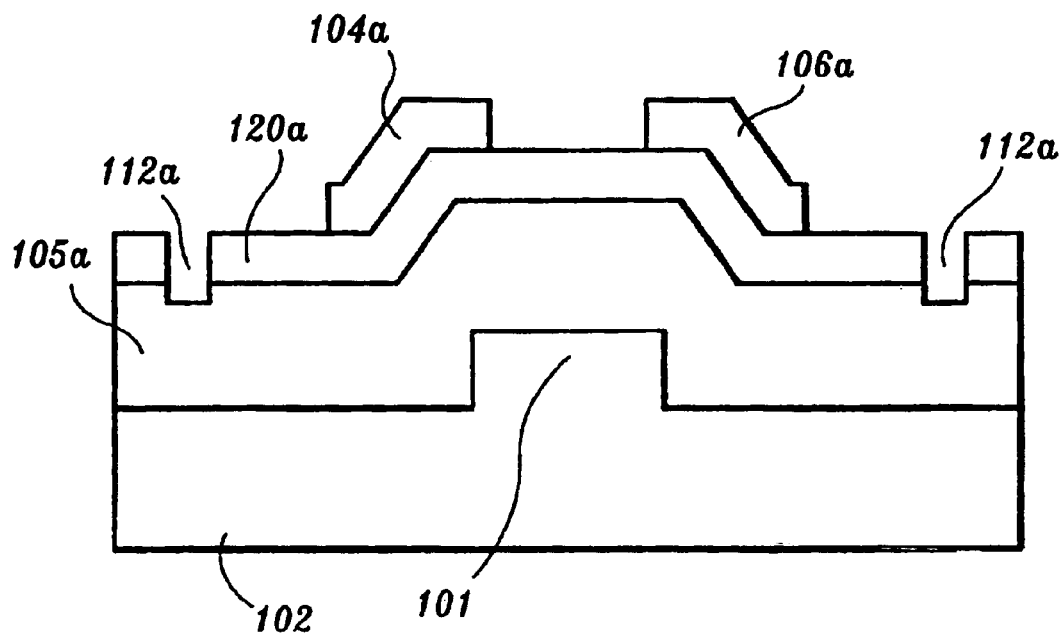
FIG. 9 is a cross-sectional view of the TFT of FIG. 7 showing electrodes deposited on the cuprate surface for forming the source and drain electrodes, in accordance with the present invention.

Referring to FIG. 9, electrodes 104*a* and 106*a* are deposited as a layer of conductive material, for example, platinum, on layer 120*a*. Using a stencil mask, the source 104*a* and drain 106*a* electrodes are formed.

Figure 10:
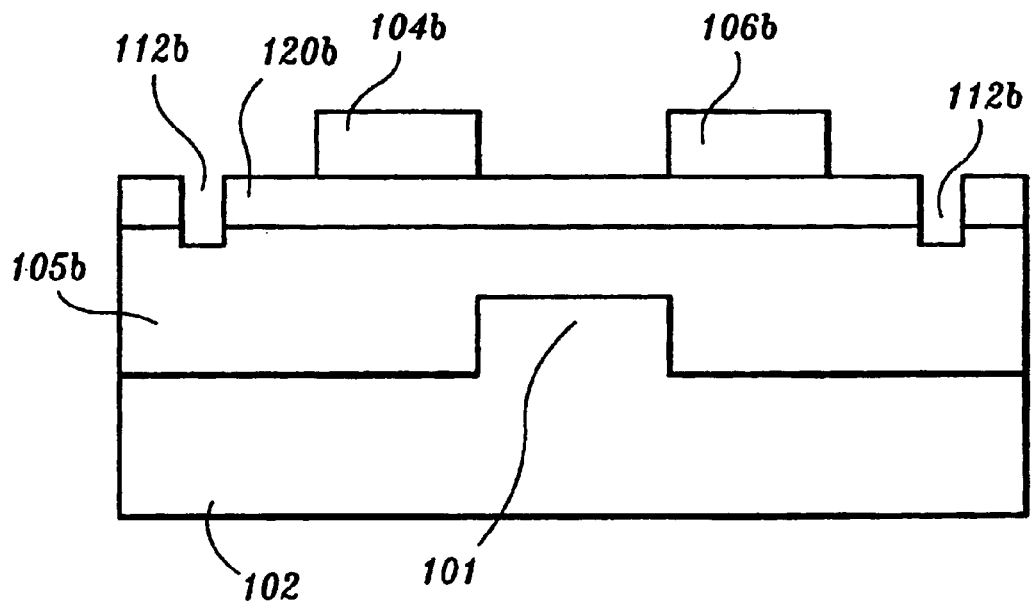
FIG. 10 is a cross-sectional view of the TFT of FIG. 8 showing electrodes formed on a flat cuprate surface forming the source and drain electrodes, in accordance with the present invention.

Referring to FIG. 10, electrodes 104*b* and 106*b* are formed, preferably of platinum, on a flat surface of layer 120*b* using a stencil mask. Source 104*b* and drain 106*b* electrodes are formed by a patterning process.

The dual-type TFT device structure is completed by forming a laser isolation trench 112*a* and 112*b* (FIGS. 9 and 10). The final discrete three terminal TFT device structure is also shown in FIG. 2.

Figure 11:
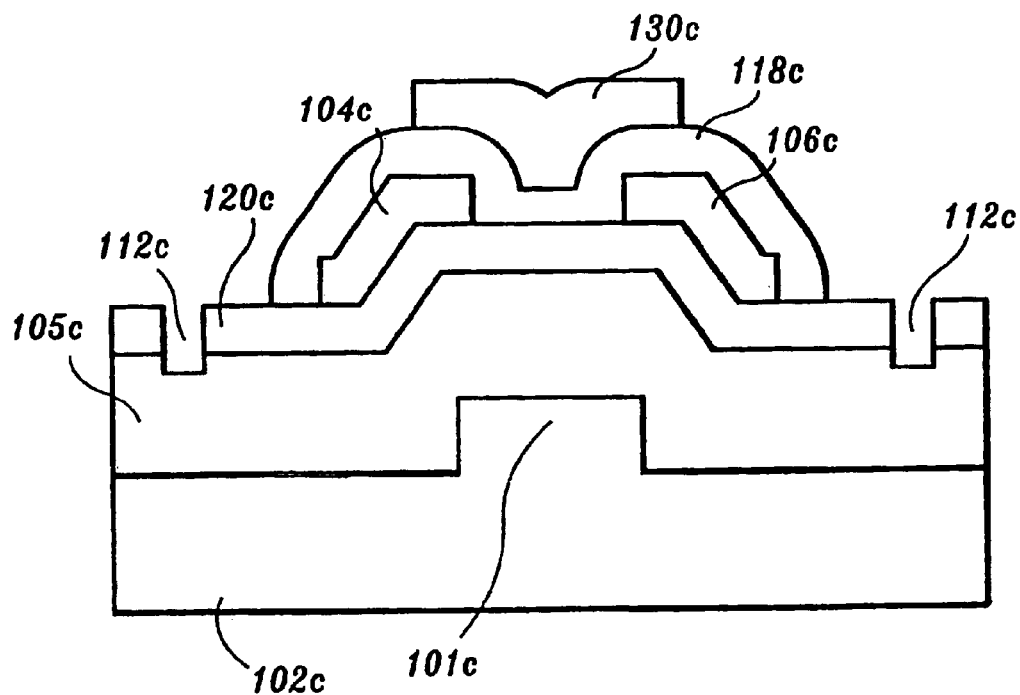
FIG. 11 is a cross-sectional view of the TFT of FIG. 9 showing a thin insulating layer over the electrodes and a conducting layer which forms a top gate electrode to serve as a fourth terminal of the TFT device in accordance with the present invention.
Figure 12:
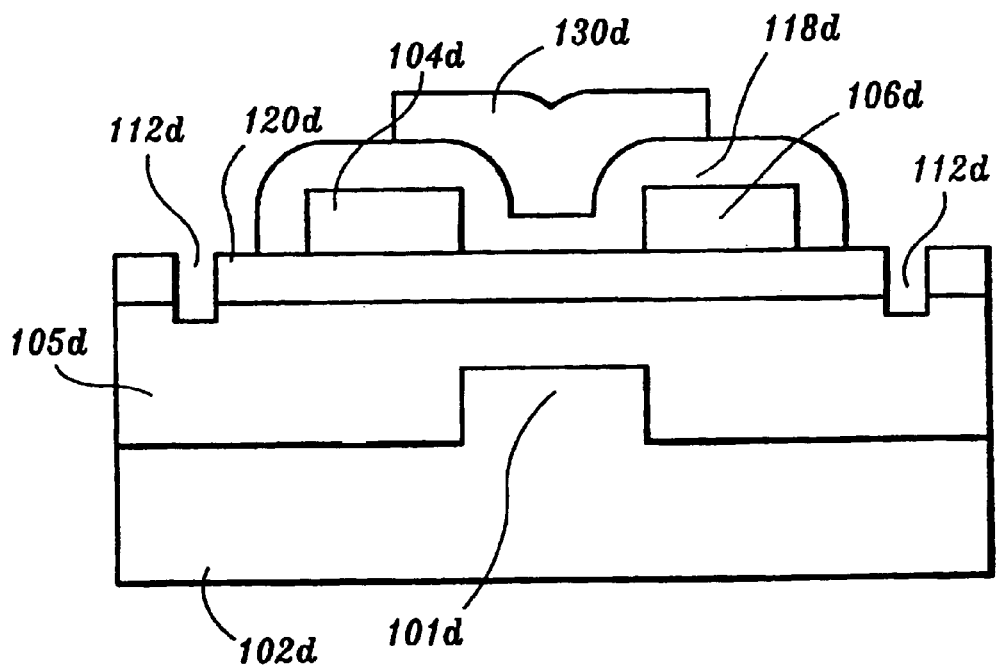
FIG. 12 is a cross-sectional view of the TFT of FIG. 10 showing a thin insulating layer over the electrodes and a conducting layer which forms a top gate electrode to serve as a fourth terminal of the TFT device in accordance with the present invention.

To enhance conduction channel carrier concentrations and to control-threshold (turn-on) voltage, another top gate 130*c* and 130*d* may be added as shown in FIG. 11 or FIG. 12 to complete four terminal TFT devices. These steps include depositing another layer of insulating material 118*c* and 118*d*, then depositing and patterning a metal layer 130*c* and 130*d* to form another gate. FIG. 11 depicts the TFT process to deposit another thin insulating material layer 118*c*, such as STO, over the electrodes (104*c*, 106*c*) by preferably depositing a Nb-STO conducting layer 130*c* to form a top gate electrode, which serves as a fourth terminal of the TFT device.

FIG. 12 depicts another step in the TFT process for depositing another thin insulating layer 118*d* over flat electrodes (104*d*, 106*d*), which are preferably formed from platinum, and then depositing a conducting layer, preferably Nb-STO, to form a top gate electrode 130*d*, which serves as a fourth terminal of the TFT device.

Device Operation Principles

A channel material layer 120 is preferably comprised of $YBa_2Cu_3O_7$ (YBCO). YBCO thin film materials generally have no long-range crystalline order. These types of materials are also called Mott-insulator materials. Referring now to FIG. 13*a*, energy band structures 201 and 203 of these types of materials are very similar to non-crystalline band structures. In general, the YBCO material includes localized states that introduce charge trap states within the energy band gap as depicted in FIG. 13*b*. Here, these localized gap states (including acceptor-like states 213 and donor-like states 215) are distributed uniformly (see FIG. 13*c*, curve 206) through the material. The Fermi level EF also labeled 235 in FIG. 13*a* in undoped materials is typically near midgap 207. FIGS. 13*a–c* illustrate a band diagram of a field-effect metal-insulator-Mott-insulator material structure (see also FIGS. 16–17 where Nb-STO 270 is metal—STO 280 is the insulator and YBCO 290 is the Mott insulator) or M-I-Mt capacitor in which the Mott-insulator material is the thin layer with a localized density of $N_t$ (labeled as 208 in FIG. 13*c*).

For simplicity, it is assumed that flatband conditions prevail at zero gate bias ($V_g$=0). When the localized density is high, charge neutrality is obtained in the Mott-insulator material when the Fermi-level 235 is at the midgap 207.

Referring to FIG. 14, an example of an energy-band diagram of a M-I-Mt structure, illustrating n-channel formation when positive voltage is applied to the gate is shown. Application of small positive gate voltage begins to bend the bands down. As the bands 201*a* and 203*a* bend down at a surface of STO layer 205, some localized states above midgap 207a become filled with electrons. As these are acceptor-like states, the negative charge, $Q_t$ 208, in these states balances the positive charge on the gate. At least for small gate voltages, the conduction band (Ec) is not very close to the Fermi-level. As a result, the number of electrons in the conduction band is small. In FIG. 14, the negative charge traps are indicated by $Q_t$ 208. For a larger gate voltage, ($V_g$>0) 235a, as shown in FIG. 14, the Fermi level 207a comes close to the conduction band 201a and a significant number of electrons $Q_n$ 204 are formed in the conduction band 201a. Thus, the n-type conducting channel is formed. The conduction channel functions in an electron accumulation layer. The positive gate voltage will attract a negative charge in the semiconductor which, in the case of n-type semiconductors, will include an enhanced concentration, i.e., accumulation, of electrons near the oxide-YBCO interface.

Referring to FIG. 15, an example of an energy-band diagram of a M-I-Mt structure is shown, illustrating p-channel formation when a negative voltage is applied to the gate. Application of a small negative gate voltage begins to bend the bands up. Bands 201b and 203b bend up at the surface of layer 205b. As a result, some localized states below midgap become filled with holes. As these are donor-like states, the positive charge in these states balances the negative charge on the gate. At least for small gate voltages, the valence band ($E_v$) is not very close to the Fermi-level. As a result, the number of holes in the valence band is small. In FIG. 15, the positive charge traps are indicated by $Q_t$ 209. For a larger gate voltage ($V_g$<0) 235b, as shown in FIG. 15, the Fermi level 207b comes close to the valence band 203b and a significant number of holes, $Q_p$ 205, are formed in the valence band 203b. Thus, a p-type conducting channel is formed. The conduction channel functions in a hole accumulation layer. The negative gate voltage will attract a positive charge in the conducting channel which, in the case of p-type semiconductors, will include an enhanced concentration, i.e., accumulation, of holes near the oxide-YBCO interface.

Figure 16:
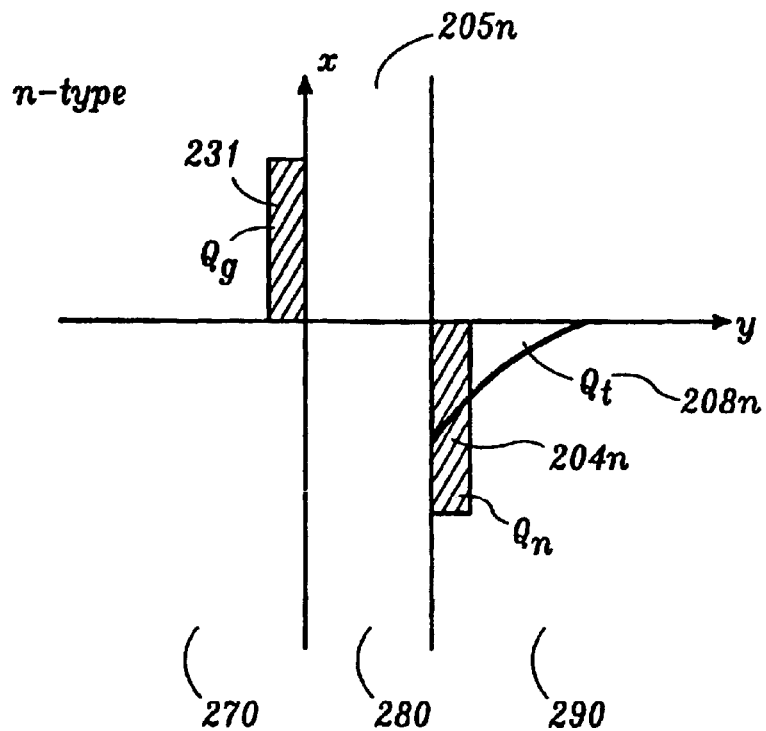
FIG. 16 depicts an example of a charge distribution of an M-I-Mt structure, illustrating an n-channel formation with positive voltage applied to the gate in accordance with one aspect of the present invention.

Referring to FIG. 16, an example of a charge distribution in a M-I-Mt is shown (with Nb-STO 270, STO 280 and YBCO 290), illustrating a n-channel formation with positive voltage applied to the gate. For charge neutrality of the device, it is required that $Q_g=Q_n+Q_t$, where $Q_g$ 231 represents the positive charge per unit area on the gate, Qn 204n represents the conducting electrons in the conduction band and $Q_t$ 208n represents localized charge states above the midgap being filled with electrons. The charge distribution under an electron accumulation condition is related to the energy band diagram as shown in FIG. 14.

Figure 17:
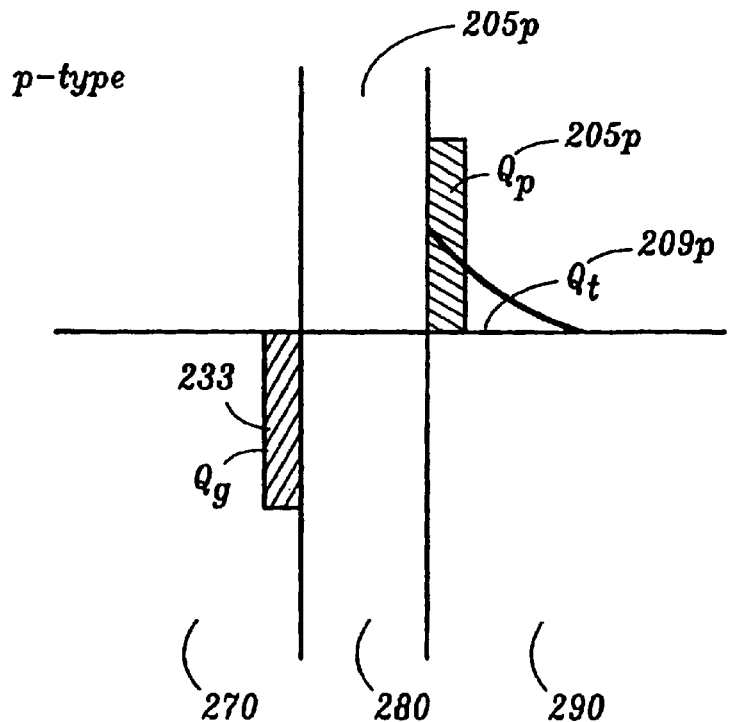
FIG. 17 depicts an example of a charge distribution of an M-I-Mt structure, illustrating a p-channel formation with negative voltage applied to the gate in accordance with another aspect of the present invention.

Referring to FIG. 17, an example of a charge distribution in a M-I-Mt (270-280-290) structure, illustrating a p-channel formation when negative voltage is applied to the gate is shown. Similarly, for charge neutrality of the device, it is required that $Q_g=Q_p+Q_t$, where $Q_g$ 233 represents the negative charge per unit area on the gate, $Q_p$ 209p represents the conducting holes in the valence band and $Q_t$ 209p represents the localized charge states below the midgap being filled with holes. The charge distribution under a hole accumulation condition is related to the energy band diagram as shown in FIG. 15.

Figure 18:
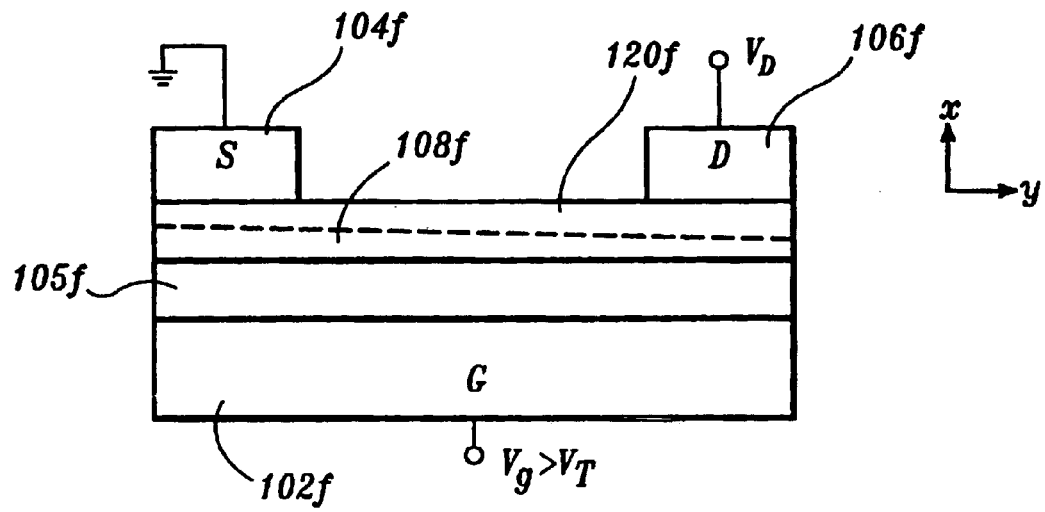
FIG. 18 is a cross-sectional view of a dual type TFT in operation showing a linear region (low drain region) formed in accordance with the present invention.

Referring to FIG. 18, an example of a MTFT operation in the linear region (low drain region) is illustratively depicted. A larger positive voltage $V_g$>$V_t$ ($V_t$ is a threshold voltage) is applied to the gate (G) 102f, causing electron accumulation at the YBCO 120f surface. If a small drain voltage is applied, a current will flow from the source(S) 104f to the drain (D) 106f through the conduction channel 108f. Thus, the channel acts as a resistor, and the drain current is proportional to the drain voltage. This is the linear region.

Figure 19:
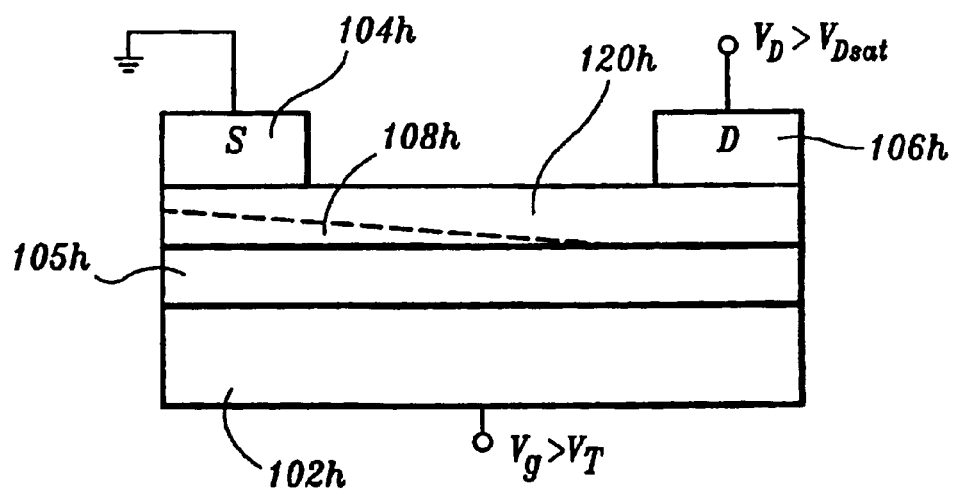
FIG. 19 is a cross-sectional view of a dual type TFT in operation showing a saturation region formed in accordance with the present invention.

Referring to FIG. 19, an example of the MTFT operation in the saturation region is illustratively shown. As the drain voltage increases, the drain voltage eventually reaches a point at which the channel 108h depth at drain 106h is reduced to zero. This is called the pinch-off point. Beyond the pinch-off point, the drain current remains the same. This is the saturation region.

Table 1 depicts the mathematic equations for the dual-type TFT. The threshold voltage ($V_t$) of the dual-type FET are shown in table 1. The threshold voltages ($V_t$) are strongly related to localized gap states and completely different from those for silicon FET devices. However, the drain current versus the drain voltage (I–V) relationships are the same as the expressions obtained for the silicon FET in the square-law approximation.

TABLE 1

Important Equations for Dual-Type TFTs.

| | n-type | p-type |
|---|---|---|
| Threshold Voltage ($V_t$) | $V_g > 0$, $V_t > 0$, $V_d > 0$ $V_t = qN_t (E_F - E_E)$ $t_s/C_{ox}$ when $Q_n = Q_t$ | $V_g < 0$, $V_t < 0$, $V_d < 0$ $V_t = qN_t (E_F - E_i)$ $t_s/C_{ox}$ when $Q_p = Q_t$ |
| I-V Linear Regions | $Q_n = Q_g - Q_t$ $I_D = C_{ox} (W/L) \mu_{neff} \cdot [(V_g - V_t) V_D - V_D^2/2]$ | $Q_p = Q_g - Q_t$ $|I_D| = C_{ox} (W/L) \mu_{neff} \cdot [|V_g - V_t| [V_D - V_D^2/2]$ |
| I-V Saturation Regions | $I_D = C_{ox} (W/L) \mu_{neff} \cdot (V_g - V_t)^2$ | $|I_D| = C_{ox} (W/2L) \mu_{neff} \cdot (V_g - V_t)^2$ |
| Saturation Voltage | $V_{Dsat} = V_g - V_t$ | $V_{Dsat} = V_g - V_t$ |

Figure 20:
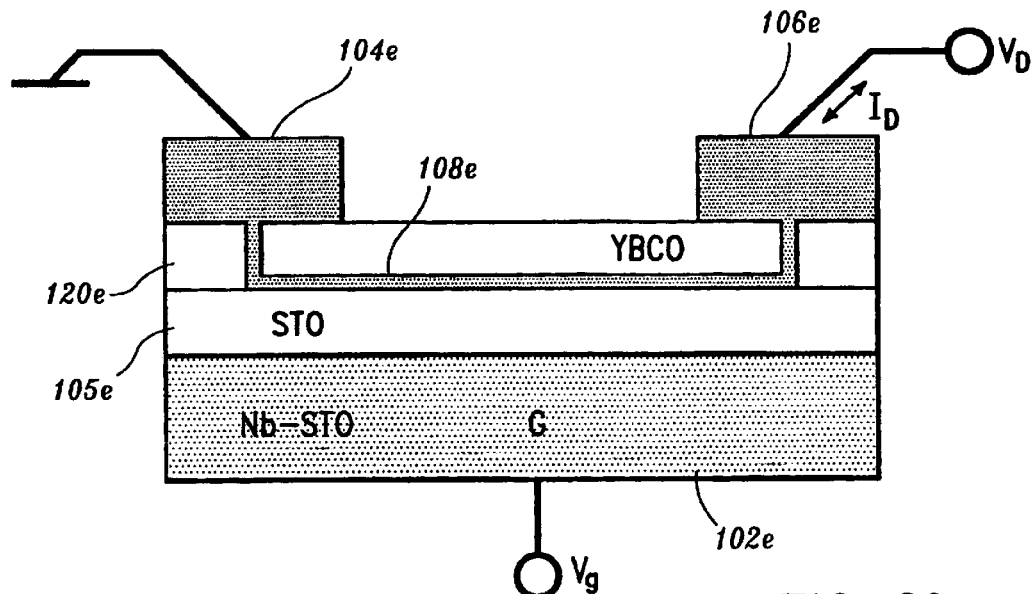
FIG. 20 is a cross-sectional view of a device structure of a dual type TFT based on a YBCO material in accordance with the present invention.

Referring to FIG. 20, a device structure of a TFT based on YBCO material in accordance with other fabrication steps is shown. As depicted, the metallic substrate 102e comprises Nb-doped STO. The substrate 102e also serves as the gate electrode (G). The gate insulator STO 105e is then grown epitaxially on the substrate 102e. Next, the channel material YBCO 120e is deposited. The source 104e and drain 106e electrodes (Pt) are then deposited by electron beam evaporation through a stencil mask. The conduction channel 108e is formed at the bottom surface of the YBCO material 120e. Drain voltage $V_D$, gate voltage $V_g$ and drain current $I_D$ are shown. These parameters are used in presenting the experimental results in the FIGS. which follow.

Figure 21:
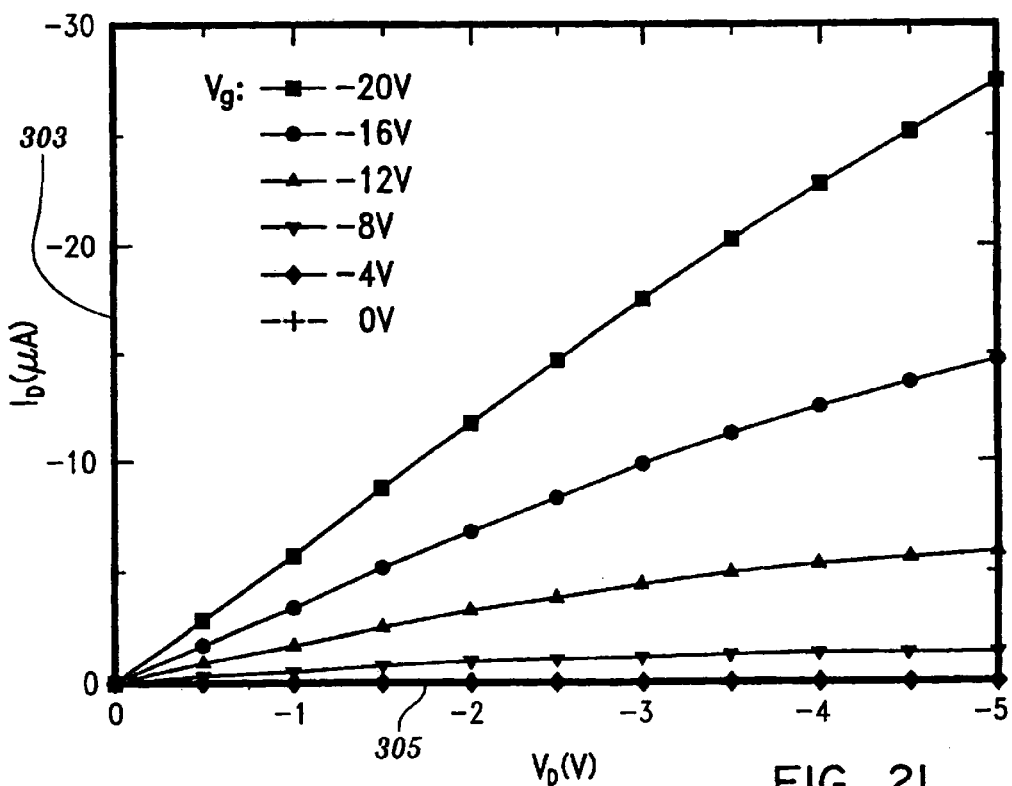
FIG. 21 is a plot of experimental data of drain current versus drain voltage for a dual type TFT in accordance with the present invention where a gate voltages (Vg) is varied between −20 to 0 Volts.

Referring to FIG. 21, an experimental demonstration of drain current 303 versus drain voltage 305 with channel material YBCO is illustratively shown for a device formed in accordance with the present invention. Gate voltages $V_g$ are −20, −16, −12, −8, −4 and 0 V as indicated.

Figure 22:
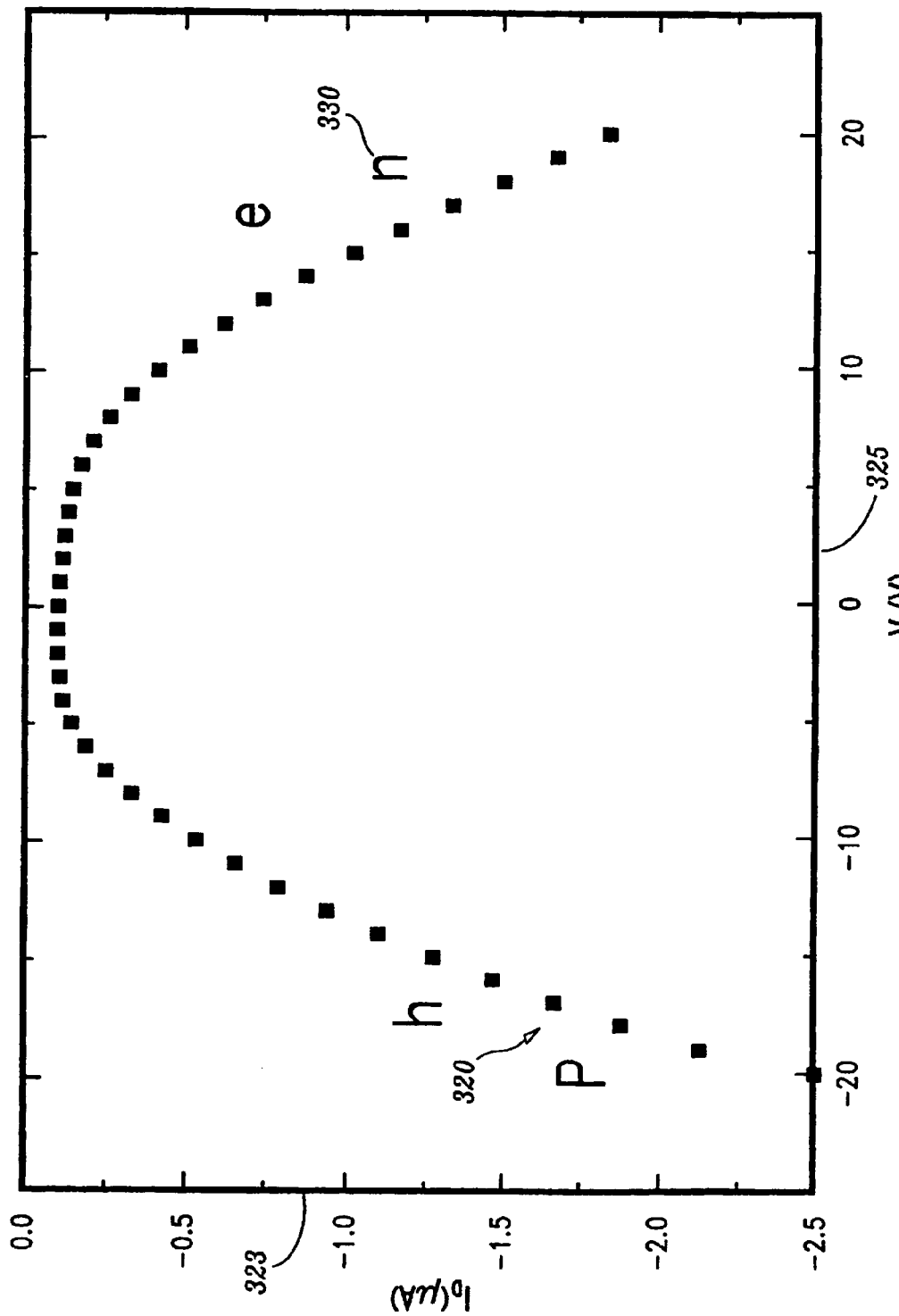
FIG. 22 is a plot of experimental data of drain current versus gate voltage for dual type conduction of a single device in accordance with the present invention.

Referring to FIG. 22, another experimental demonstration of drain current 323 versus gate voltage 325 for dual type conduction is illustratively shown. It demonstrates the nearly symmetrical $I_D$ versus $V_g$ characteristics of a dual type TFT. Portion 320 includes hole current while portion 330 includes electron currents with a transition at 0 volts for $V_g$.

Figure 23:
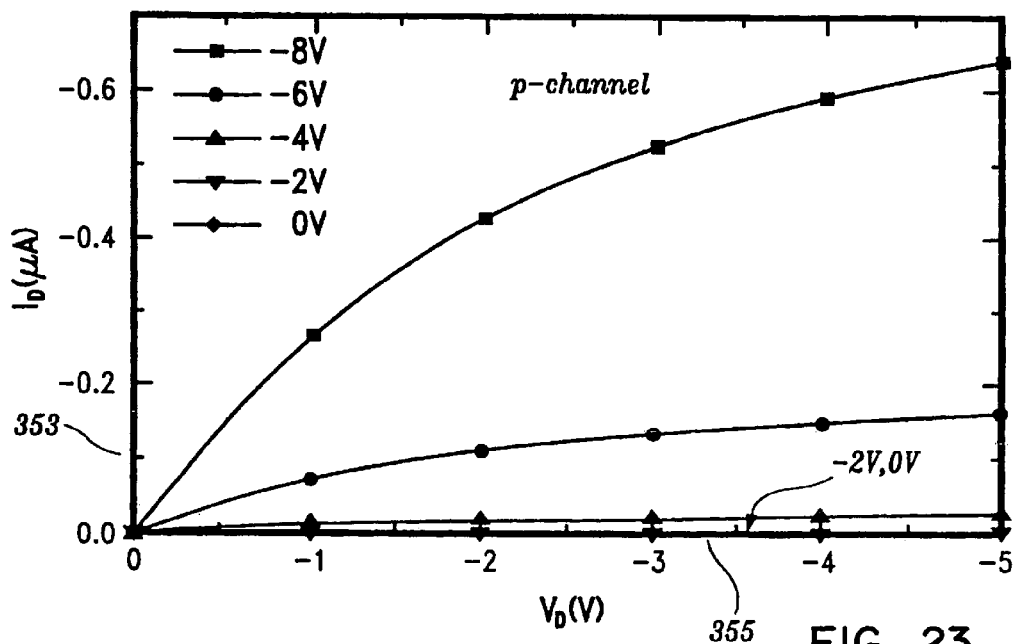
FIG. 23 is a plot of experimental data of drain current versus drain voltage for several different gate voltages for an TFT in a p-channel mode in accordance with the present invention.

Referring to FIG. 23, another experimental demonstration of drain current 353 versus drain voltage 355 for several different gate voltages of a p-channel is illustratively shown in accordance with the present invention. The results show dual type TFT I-V characteristics.

Figure 24:
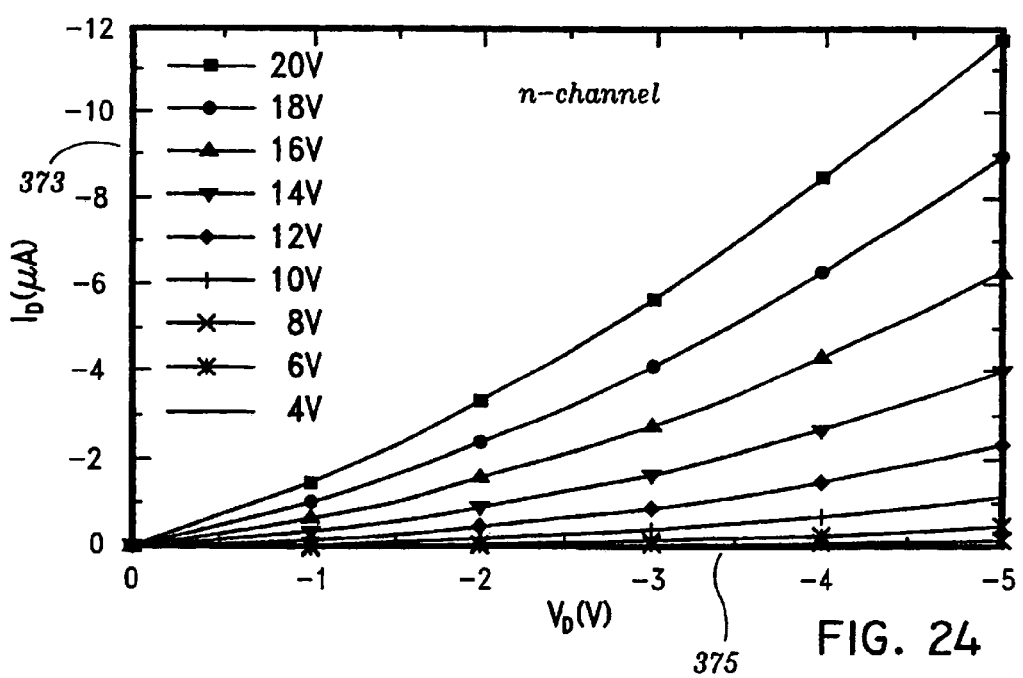
FIG. 24 is a plot of experimental data of drain current versus drain voltage for several different gate voltages for an TFT in a n-channel mode in accordance with the present invention.
Figure 25:
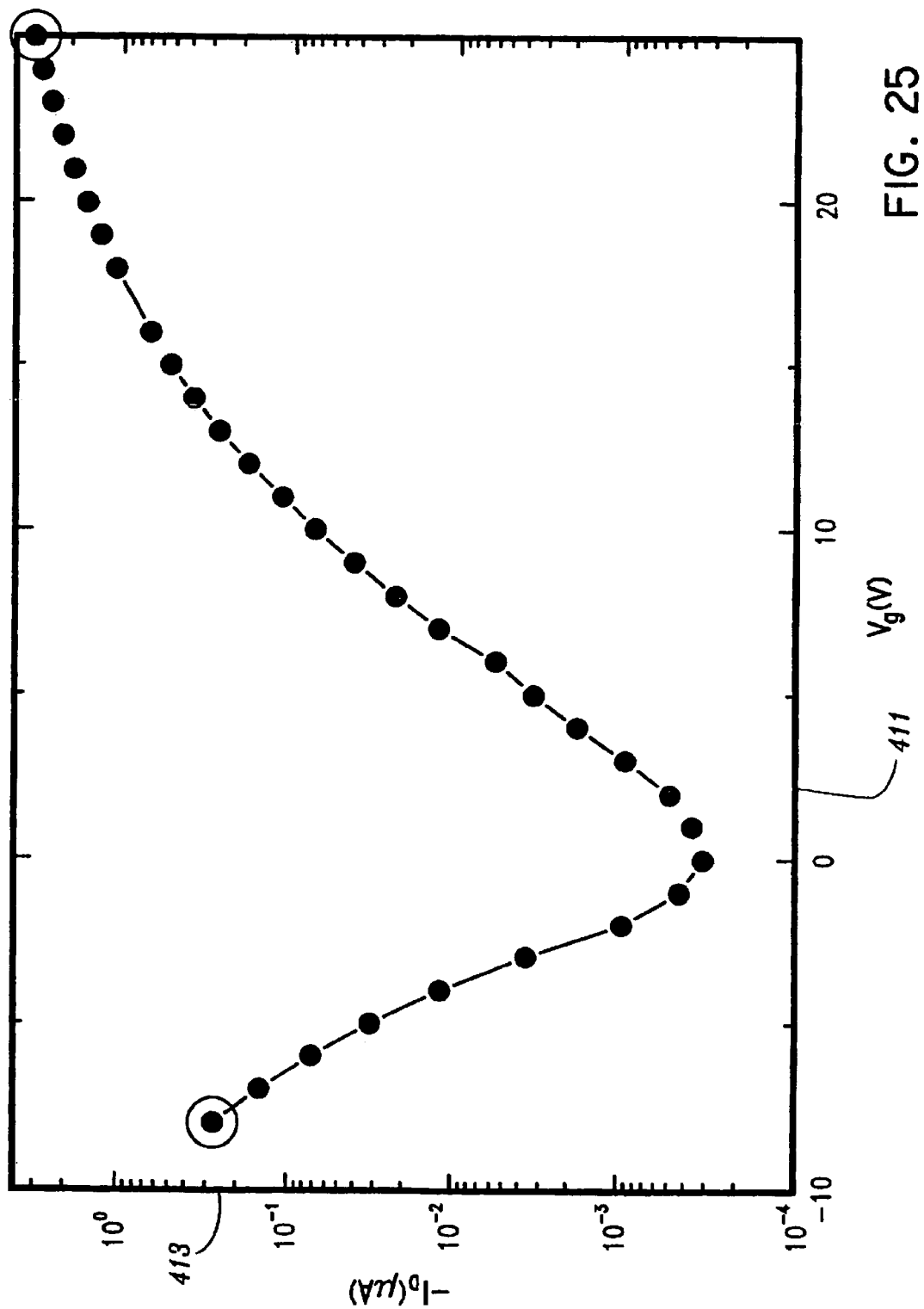
FIG. 25 depicts a graph showing a high on/off current ratio for a dual type TFT in accordance with the present invention.

Referring to FIG. 24, yet another experimental demonstration of drain current 373 versus drain voltage 375 for several different gate voltages of an n-channel dual type TFT is illustratively shown.

Figure 26:
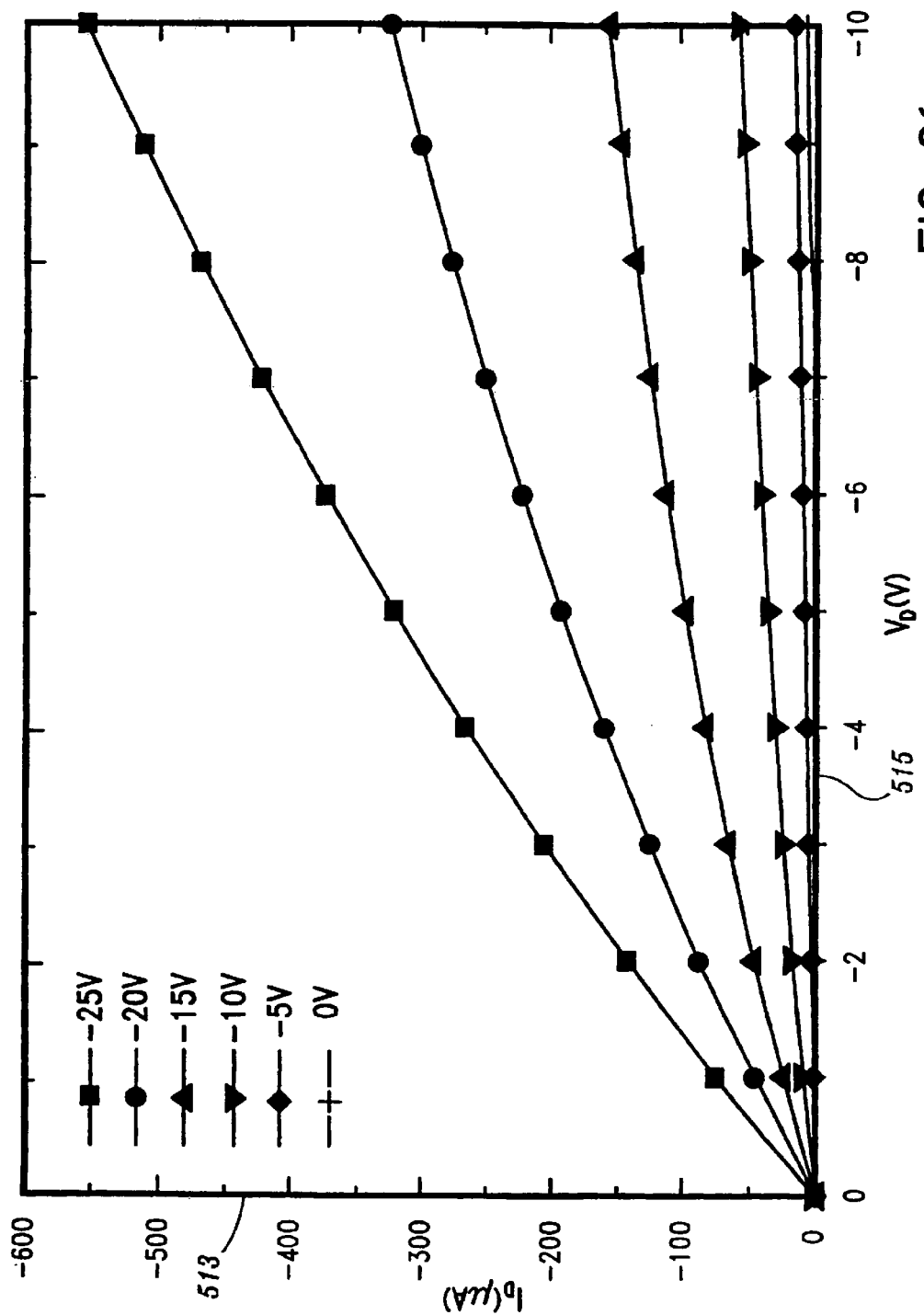
FIG. 26 is a plot of experimental data of drain current versus drain voltage for several different gate voltages for a dual type TFT showing current-voltage characteristics for p-channel mode in accordance with the present invention.
Figure 27:
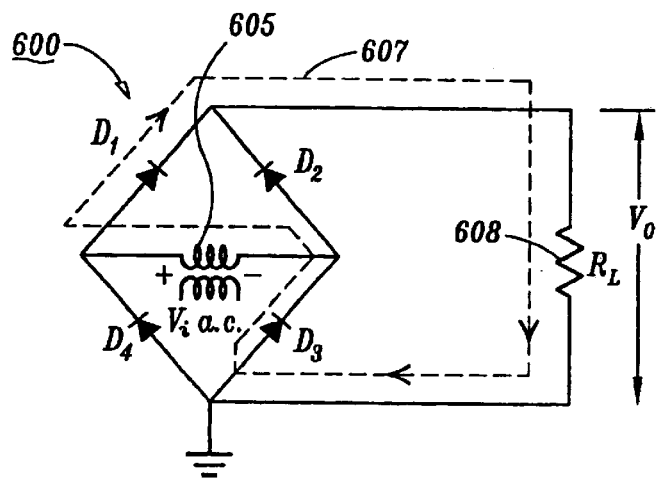
FIG. 27 is a schematic diagram of a prior art full-wave diode bridge rectifier circuit.

FIG. 26 shows another experimental demonstration of a high on/off current ratio of the dual type TFT. It illustratively demonstrates the drain current 413 versus the gate voltage 411 from −10V to 20V. FIG. 27 shows another experimental demonstration of current-voltage characteristics of the p-channel TFT. It illustratively demonstrates drain current 513 versus drain voltage 515 with YBCO channel material. Gate voltages $V_g$ are −25, −20, −15, −10, −5 and 0 V.

Applications

Those skilled in the art will appreciate that the single device providing a dual (n/p) type operation will lead to many new applications. An illustrative example is now disclosed for a power circuit application.

Figure 28A:
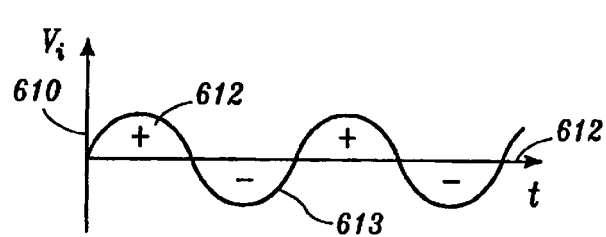
FIG. 28a is a plot of input voltage versus time representing-an input signal.
Figure 28B:
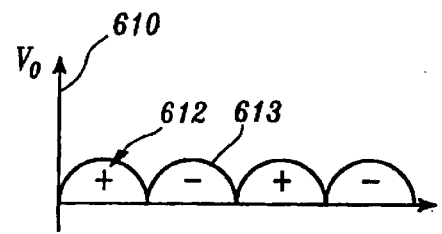
FIG. 28b is a plot of output voltage versus time for the circuit of FIG. 27.

Referring to FIGS. 27, 28a and 28b, a prior art, full-wave diode bridge rectifier circuit 600 and voltage input/out versus time (t) graphs are shown. As depicted, during a positive portion 612 of input cycle in FIG. 28a when a transformer 605 polarity is as indicated, diodes $D_1$ and $D_3$ are conducting, and the current passes from the positive to negative of the load $R_L$. The conduction path is shown as dashed line loop 607. During the next negative half cycle 613, the transformer 605 reverses its polarity, and diodes $D_2$ and $D_4$ are conducting and send current through the load $R_L$ in the same direction as during the previous positive half cycle 612. The output is shown in FIG. 28b.

Figure 29:
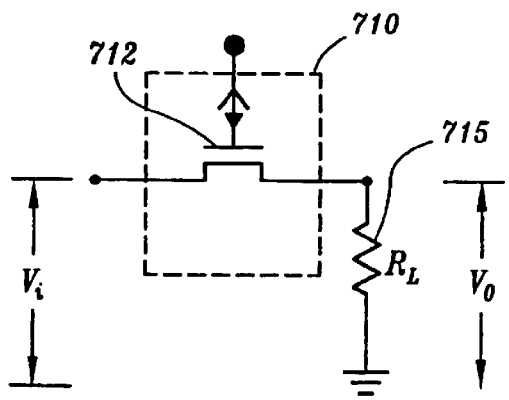
FIG. 29 is a schematic diagram of a dual type TFT rectifier circuit in accordance-with the present invention.
Figure 30:
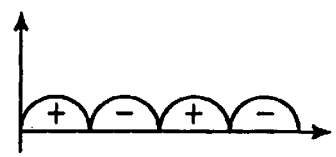
FIG. 30 is a plot of output voltage versus time for the circuit of FIG. 29.
Figure 31:
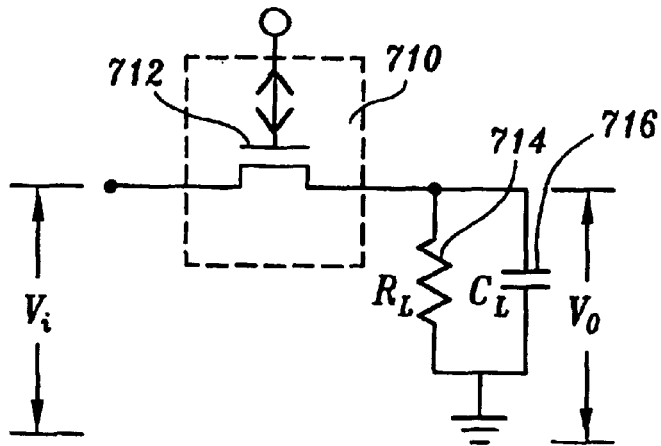
FIG. 31 is a schematic diagram of another dual type TFT rectifier circuit in accordance with the present invention.
Figure 32:
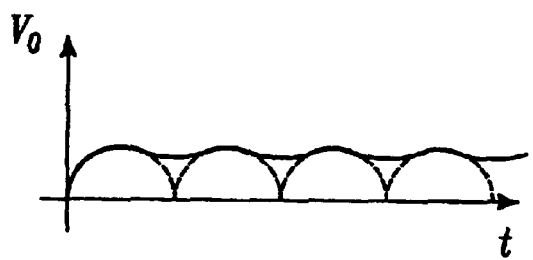
FIG. 32 is a plot of output voltage versus time for the circuit of FIG. 31.

Referring to FIGS. 28a and 29–32, according to the present invention, the 4 diodes $D_1$, $D_2$, $D_3$ and $D_4$ (FIG. 27) can be replaced by one dual-type TFT device 710, as shown in FIGS. 29 and 31, respectively. During the positive portion 612 of the input cycle when a negative gate voltage is applied to a gate 712 of the TFT, a p-channel is formed, and the current passes from the positive to negative of the load ($R_L$ 715 in FIG. 29 or $R_L$ 714 and $C_L$ 716 in FIG. 31). During the negative portion 613 of the input cycle, a positive gate voltage is applied to the gate 712 of the TFT 710 and thus an n-channel is formed. Then, the current through the load $R_L$ 715 (or $R_L$ 714 and $C_L$ 716) is the same direction as during the previous positive half cycle 613 as shown in FIGS. 30 and 32.

Figure 33:
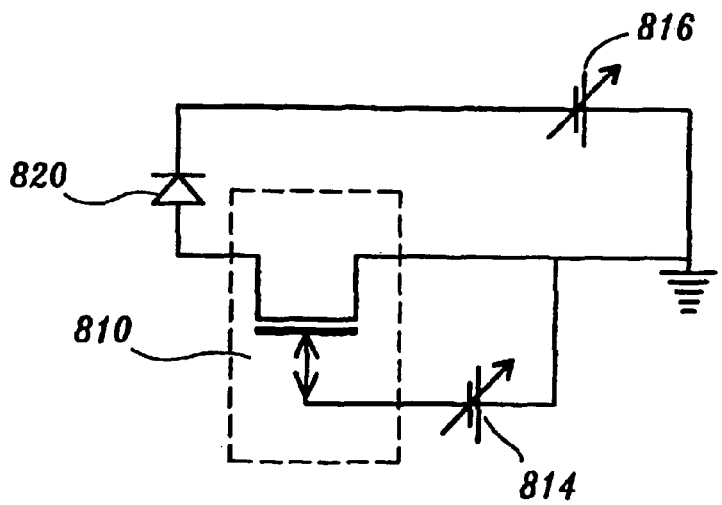
FIG. 33 is a schematic diagram of an organic LED driven by a dual type TFT in accordance with the present invention.

Referring to FIG. 33, another illustrative application of the present invention is shown. An organic light emitting diode (LED) 820 is driven by a dual type MTFT 810 (preferably including YBCO) in accordance with the invention. A gate voltage is modulated from a voltage supply 814. LED 820 is connected to a voltage supply 816. The light output is proportional to the LED current. The integration of organic LED and YBCO TFT will be of great benefit for future smart displays.

The illustrative examples described here are an example of ways in which to employ the present invention and are not in any way to be construed to be limiting the present invention. It will be evident to those skilled in the art that the applications of the present invention are far reaching and too numerous to be described here. It is also important to note that the materials and dimensions described herein may be changed or substituted with other materials and dimensions having similar properties and characteristics. The present invention advantageously provides a more space efficient, lower power and simpler solution to conventional circuits.

Some of the advantages of the present invention include:

1. a scalable device which is scalable to 10 nm channel lengths and beyond;
2. switching times of the order of about 0.1 picoseconds; and
3. dual-type (n/p) characteristics.

Having described preferred embodiments of a dual-type thin-film field-effect transistors and applications (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming a transistor having a chemically undoped channel that provides an electronically induced p-channel or n-channel conduction based on a polarity of an applied gate voltage, the method comprising the steps of:

forming a gate layer;

depositing an insulating layer on the gate layer;

forming a chemically undoped channel layer on the insulating layer by:

epitaxially depositing a cuprate layer on the insulating layer in an oxygen environment to provide a substantially defect free cuprate layer, the cuprate layer comprising YBCO; and annealing the cuprate layer in a reducing environment and oxygen annealing the cuprate layer to adjust an oxygen content of the cuprate layer to provide a channel layer of $YBa_2Cu_3O_{7-\delta}$ where $\delta$ is between about 0 and about 1; and forming source and drain electrodes on the chemically undoped channel layer.

2. The method as recited in claim 1, wherein the step of forming a gate layer includes the step of patterning the gate layer to form a recessed gate structure.

3. The method as recited in claim 1, wherein the step of forming a gale layer includes the step of doping the gate layer.

4. The method as recited in claim 1, wherein the step of annealing includes the step of maintaining a temperature of between about 200° C. and about 500° C. for between about 0.2 hours and about 5 hours.

5. The method as recited in claim 1, wherein the step of annealing includes the steps of annealing in a reducing environment including one of a vacuum and an inert gas.

* * * * *